(12) United States Patent
Cho et al.

(10) Patent No.: US 7,982,246 B2
(45) Date of Patent: Jul. 19, 2011

(54) SELECTION TRANSISTOR

(75) Inventors: Byung-kyu Cho, Seoul (KR); Hee-soo Kang, Seoul (KR); Dong-uk Choi, Gyeonggi-do (KR); Choong-ho Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 12/486,367

(22) Filed: Jun. 17, 2009

(65) Prior Publication Data

US 2009/0309154 A1    Dec. 17, 2009

(30) Foreign Application Priority Data

Jun. 17, 2008  (KR) .................. 10-2008-0057019

(51) Int. Cl.
   *H01L 29/76*    (2006.01)
(52) U.S. Cl. ........................ 257/213; 257/386
(58) Field of Classification Search .................. 257/213, 257/386
   See application file for complete search history.

(56) References Cited

U.S. PATENT DOCUMENTS

| | | | | |
|---|---|---|---|---|
| 5,559,049 A | * | 9/1996 | Cho | 438/304 |
| 6,107,667 A | * | 8/2000 | An et al. | 257/408 |
| 6,362,050 B2 | | 3/2002 | Kalnitsky et al. | |
| 6,790,718 B1 | * | 9/2004 | Nakagawa | 438/195 |
| 7,148,527 B2 | * | 12/2006 | Kim et al. | 257/288 |

FOREIGN PATENT DOCUMENTS

| KR | 100213199 B1 | 5/1999 |
|---|---|---|
| KR | 1020060108326 A | 10/2006 |

* cited by examiner

*Primary Examiner* — Thien F Tran
(74) *Attorney, Agent, or Firm* — Myers Bigel Sibley & Sajovec, P.A.

(57) ABSTRACT

Provided are a selection transistor and a method of fabricating the same. A selection transistor can be formed on an active region in a semiconductor substrate to include a gate electrode that includes recessed portions of a sidewall of the gate electrode which are recessed inward adjacent lower portions of the gate electrode to define a T-shaped cross section of the gate electrode. A tunnel insulating layer can be located between the gate electrode and the active region.

8 Claims, 12 Drawing Sheets

SELECTION TRANSISTOR

CROSS-REFERENCE TO RELATED APPLICATIONS

This application claims the benefit of Korean Patent Application No. 10-2008-0057019, filed on Jun. 17, 2008, in the Korean Intellectual Property Office, the disclosure of which is incorporated herein in its entirety by reference.

BACKGROUND

The inventive concept relates to a selection transistor and a method of fabricating the same.

Semiconductor memory devices for storing data can be classified into volatile memory devices and nonvolatile memory devices. Volatile memory devices may not preserve stored data without a power supply, but nonvolatile memory devices can preserve stored data even without a power supply.

A flash memory device, which is an example of a nonvolatile memory device, can electrically write and erase data, and can be appropriate for high density and large-scale information storage. In the flash memory device, a floating gate of a cell region unit device may be too thin to achieve high density and large-scale information storage. In this regard, as the floating gate functioning as a charge storage layer is reduced in thickness, it may be difficult to commonly form a gate of a string selection transistor (SST) or ground selection transistor (GST).

SUMMARY

A selection transistor can be formed on an active region in a semiconductor substrate to include a gate electrode that includes recessed portions of a sidewall of the gate electrode which are recessed inward adjacent lower portions of the gate electrode to define a T-shaped cross section of the gate electrode. A tunnel insulating layer can be located between the gate electrode and the active region.

According to another aspect of the inventive concept, there is provided a method of fabricating a selection transistor, the method comprising forming an insulating layer and a charge storage layer on a semiconductor substrate; defining an active region of the semiconductor substrate and forming a device separation layer; sequentially forming a blocking insulating layer and a first gate layer across an upper surface of the charge storage layer and the device separation layer; exposing the active region by forming a trench in a portion on which the selection transistor is to be formed; forming a tunnel insulating layer on an exposed surface of the active region and forming an insulating layer across an exposed surface of the charge storage layer and the first gate layer; forming a second gate layer in the trench; removing the insulating layer formed across the exposed surface of the first gate layer; forming a third gate layer across an exposed surface of the first gate layer and the second gate layer; defining a gate electrode of the selection transistor; and forming a source/drain region at both sides of the gate electrode.

According to another aspect of the inventive concept, there is provided a method of fabricating a selection transistor, the method comprising forming an insulating layer and a charge storage layer on a semiconductor substrate; defining an active region of the semiconductor substrate and forming a device separation layer; forming a blocking insulating layer across the charge storage layer and the device separation layer; exposing the active region by forming a trench in a portion on which the selection transistor is to be formed; forming a tunnel insulating layer on an exposed surface of the active region and forming an insulating layer across an exposed surface of the charge storage layer; forming a first gate layer across a surface of the tunnel insulating layer, the insulating layer and the blocking insulating layer so as to cover the trench; defining a gate electrode of the selection transistor; and forming source/drain regions at both sides of the gate electrode.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
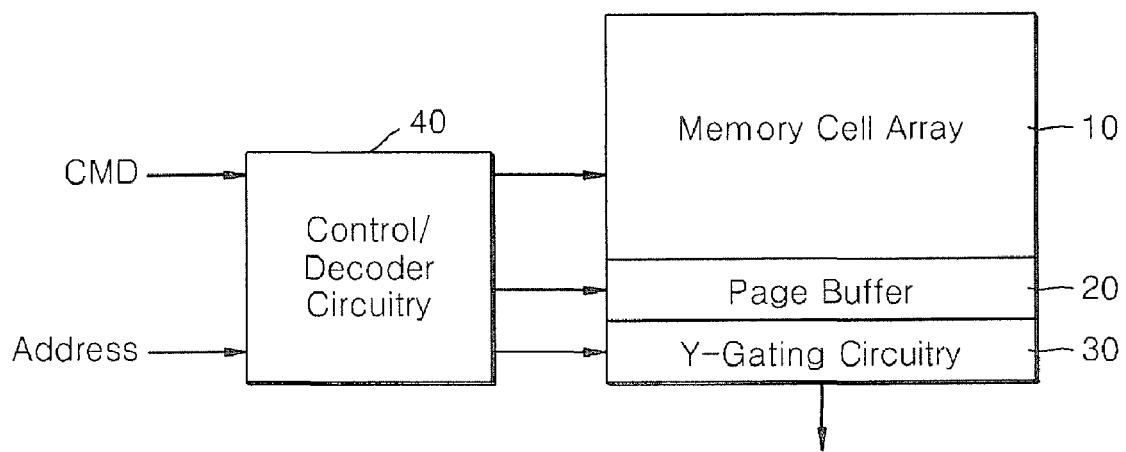
FIG. 1 is a block diagram of a nonvolatile memory device according to an embodiment of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a block diagram of a nonvolatile memory device according to an embodiment of the inventive concept.

Referring to FIG. 1, the nonvolatile memory device may include a memory cell array 10, a page buffer 20, a Y-gating circuit 30, and a control/decoder circuitry 40.

The memory cell array 10 may include a plurality of memory blocks, and each of the plurality of memory blocks may include a plurality of nonvolatile memory cells. The nonvolatile memory cells may be flash memory cells, preferably, NAND flash memory cells. The page buffer 20 can temporarily store data to be written in the memory cell array 10, or data to be read from the memory cell array 10. The Y-gating circuitry 30 can transmit data stored in the page buffer 20. The control/decoder circuitry 40 can receive a command and an address from the outside, output a control signal to write data in the memory cell array 10, to read data from the memory cell array 10, and decode the address. The control/decoder circuitry 40 may output a control signal for input and output of data to the page buffer 20 and provide address information to the Y-gating circuitry 30.

Figure 2:
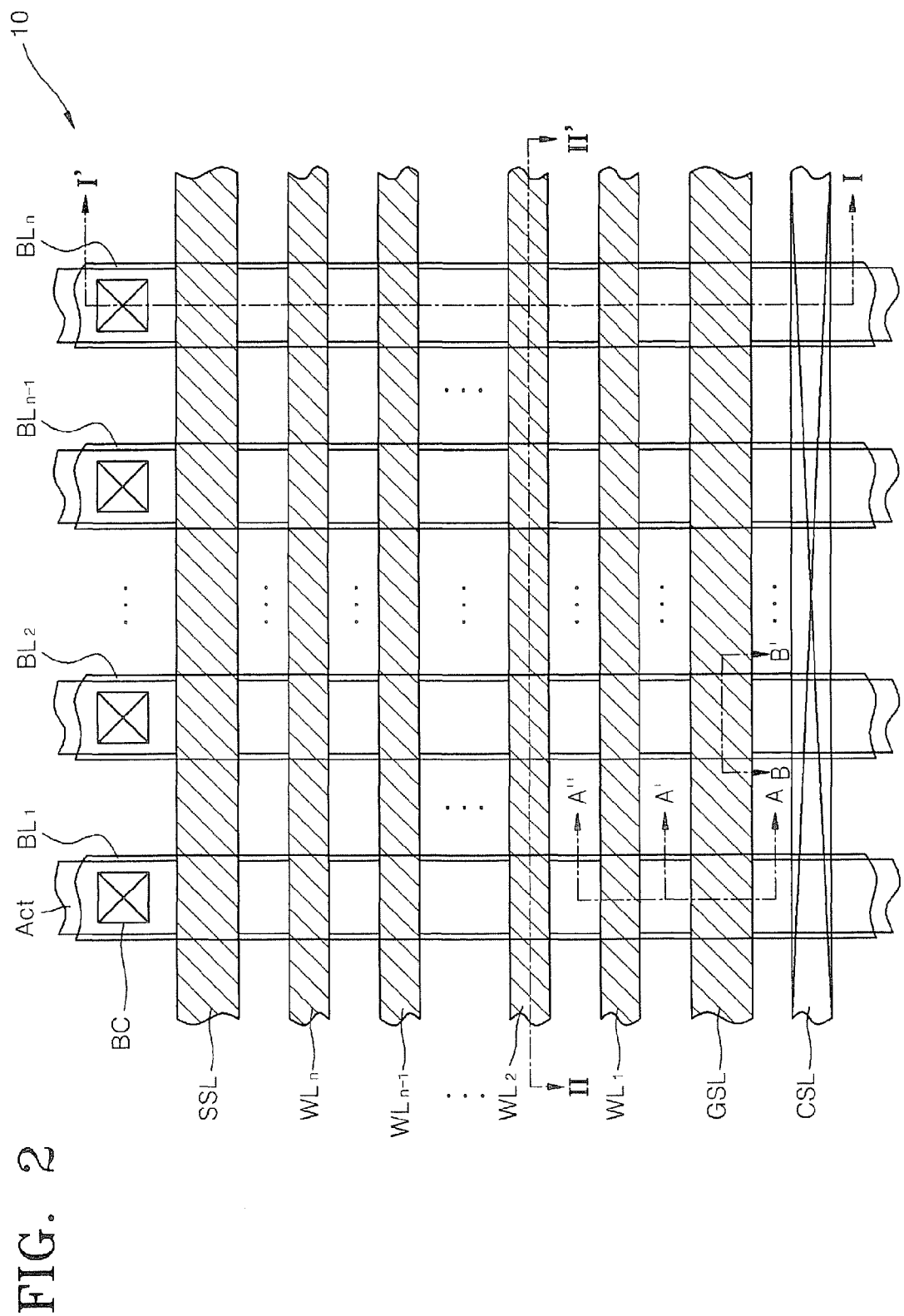
FIG. 2 illustrates the layout of a portion of a memory cell array of a nonvolatile memory device according to an embodiment of the inventive concept.
Figure 3A:
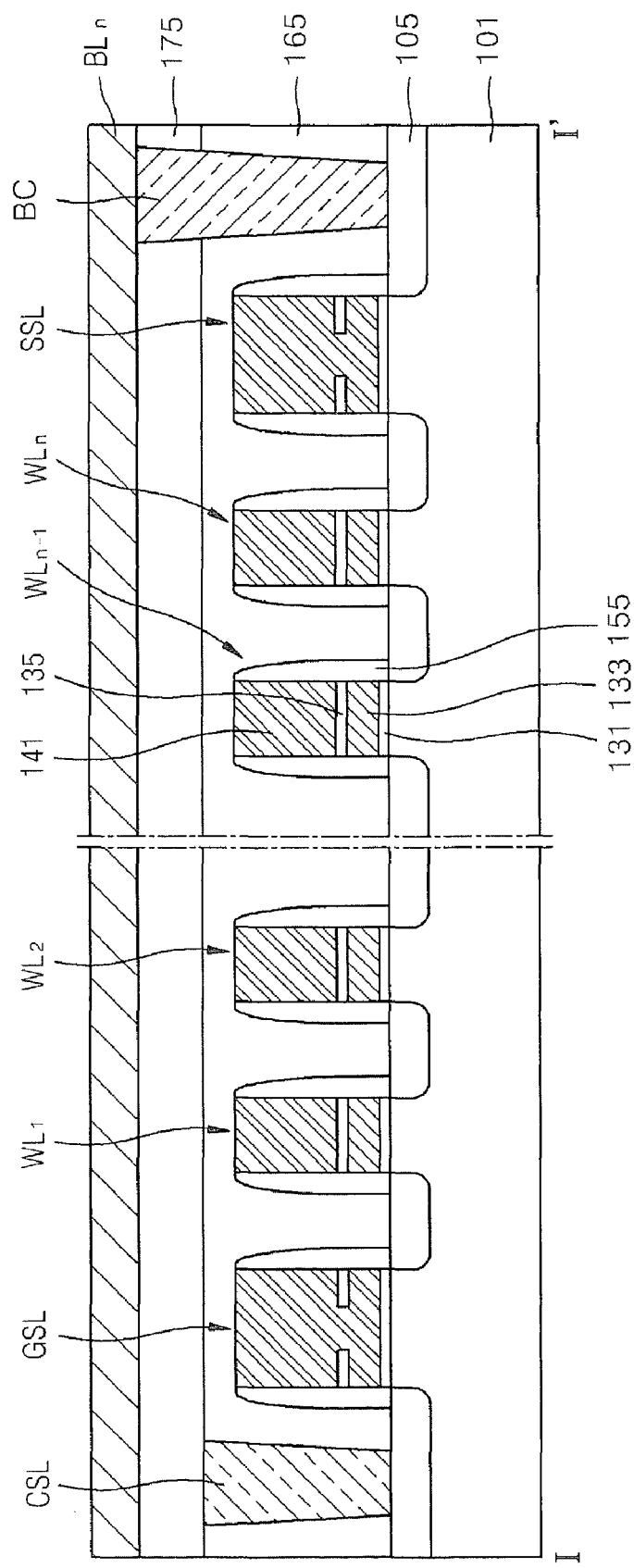
FIGS. 3A and 3B are cross-sectional views taken along lines I-I' and II-II' of FIG. 2, respectively.
Figure 3B:
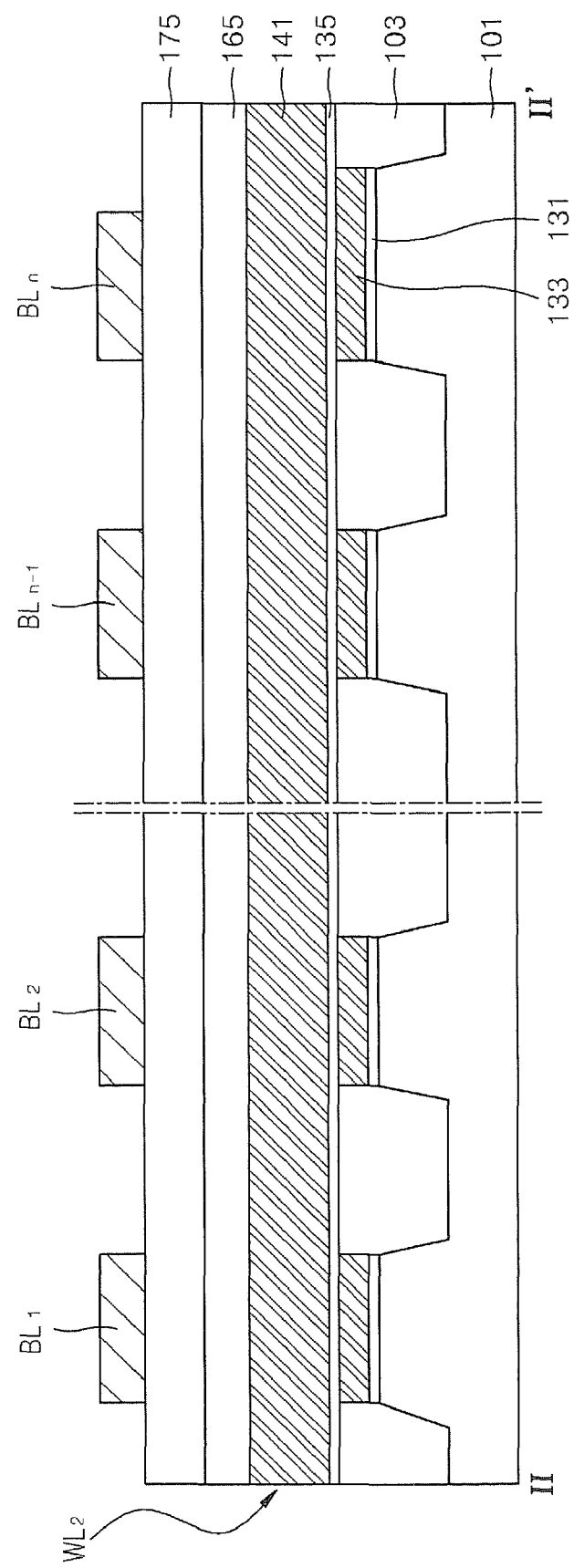
Figure 4A:
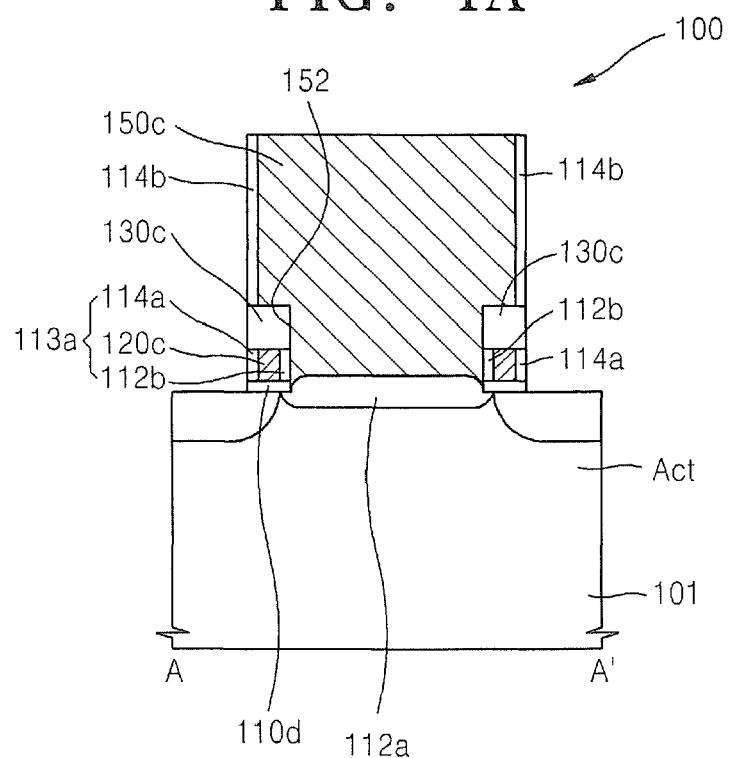
FIG. 4A is a cross-sectional view taken along line A-A' of FIG. 2, according to an embodiment of the inventive concept.
Figure 4B:
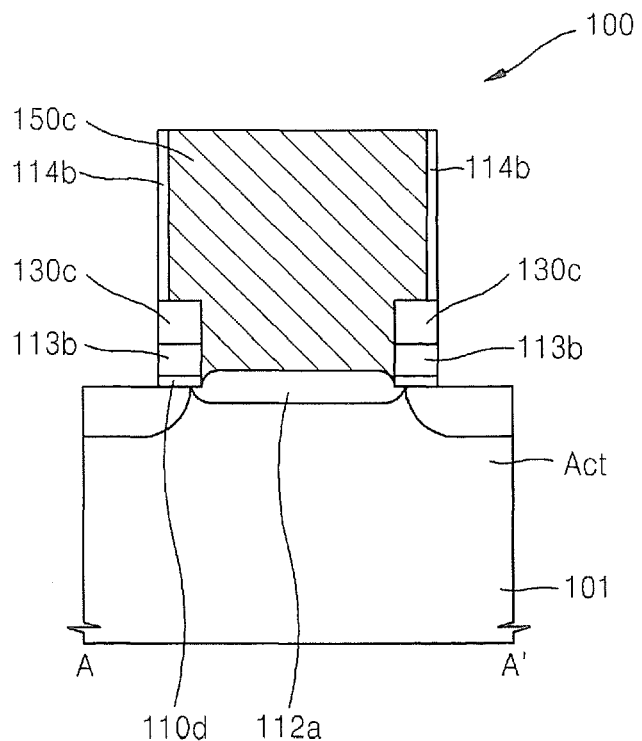
FIG. 4B is a cross-sectional view taken along the line A-A' of FIG. 2, according to another embodiment of the inventive concept.

FIG. 2 illustrates the layout of a portion of a memory cell array of a nonvolatile memory device according to an embodiment of the inventive concept. The portion of the memory cell array shown in FIG. 2 may be a portion of the memory cell array 10 in FIG. 1. FIGS. 3A and 3B are cross-sectional views taken along lines I-I' and II-II' of FIG. 2, respectively. FIGS. 4A and 4B are cross-sectional views taken along a line A-A' of FIG. 2.

Referring to FIGS. 2 and 3A and 3B, the memory cell array 10 may include a plurality of active regions Act that are defined by device isolation layers 103 formed in a semiconductor substrate 101. The semiconductor substrate 101 can include a substrate and/or an epitaxial layer, a silicon on insulator layer, or the like. The active regions Act may be provided in the shape of parallel lines.

A string selection line SSL and a ground selection line GSL may run across and over the active regions Act. A plurality of word lines $WL_1$, $WL_2$, through to $WL_{n-1}$, and $WL_n$ may run across and over the active regions Act between the string selection line SSL and the ground selection line GSL. The string selection line SSL, the ground selection line GSL, and the word lines $WL_1$, $WL_2$, through to $WL_{n-1}$, and $WL_n$, may be parallel to one another. Impurity regions 105 may be formed in the active regions Act adjacent to both sides of each of the word lines $WL_1$, $WL_2$, through to $WL_{n-1}$, and $WL_n$, the string selection line SSL, and the ground selection line GSL. As a result, a string selection transistor, cell transistors, and a ground selection transistor that are connected in series are formed. The term "selection transistor" includes both the string selection transistor and the ground selection transistor. The string selection transistor, the ground selection transistor, and the cell transistors interposed therebetween may constitute a unit memory block. The impurity region 105 disposed adjacent to the string selection line SSL and opposite to the ground selection line GSL may be defined as a drain region of the string selection transistor. Also, the impurity region 105 disposed adjacent to the ground selection line GSL and opposite to the string selection line SSL may be defined as a source region of the ground selection transistor.

Each of the word lines $WL_1$, $WL_2$, through to $WL_{n-1}$, and $WL_n$, may include a tunneling insulating layer 131, a charge storage layer 133, a blocking insulating layer 135, and a cell gate conductive layer 141 that are stacked sequentially on the semiconductor substrate 101. Although not illustrated, each of the word lines $WL_1$, $WL_2$, through to $WL_{n-1}$, and $WL_n$, may further include a cell barrier conductive layer and a word line conductive layer that are stacked sequentially on the cell gate conductive layer 141.

Each of the tunneling insulating layer 131 and the charge storage layer 133 may be separated into portions with respect to the cell transistors disposed adjacently in the direction of the word lines $WL_1$, $WL_2$, through to $WL_{n-1}$, and $WL_n$. Top surfaces of the device isolation layers 103 may be at substantially the same level as a top surface of the charge storage layer 133. The tunneling insulating layer 131 may be a silicon oxide layer. The charge storage layer 133 may be a charge trapping layer or a floating gate conductive layer. The blocking insulating layer 135 may be shared among the cell transistors disposed adjacently in the direction of the word lines $WL_1$, $WL_2$, through to $WL_{n-1}$, and $WL_n$. Spacers 155 may be disposed on the sidewalls of the tunneling insulating layer 131 and the charge storage layer 133 and on the sidewalls of the blocking insulating layer 135 and the cell gate conductive layer 141. The spacer 155 may comprise multiple layers.

The string selection line SSL and the ground selection line GSL may each have the same stack structure as the word lines $WL_1$, $WL_2$, through to $WL_{n-1}$, and $WL_n$, or alternatively may have a structure in which a part of the blocking insulating layer 135 is removed. Generally, the width of each of the string selection line SSL and the ground selection line GSL may be greater than the width of each of the word lines $WL_1$, $WL_2$, through to $WL_{n-1}$, and $WL_n$. However, this is for illustrative purposes only and is not intended to limit the scope of the inventive concept.

A first interlayer dielectric layer 165 covers the word lines $WL_1$, $WL_2$, through to $WL_{n-1}$, and $WL_n$, the string selection line SSL and the ground selection line GSL. A common source line CSL is formed through the first interlayer dielectric layer 165 to be connected to a source region of the ground selection line GSL. The common source line CSL may be formed parallel to the ground selection line GSL. A second interlayer dielectric layer 175 may be formed on the first interlayer dielectric layer 165. A bitline plug BC may be formed through the second interlayer dielectric layer 175 and the first interlayer dielectric layer 165 to be connected to a drain region of the string selection line SSL. A plurality of bitlines $BL_1$, $BL_2$, through to $BL_{n-1}$, and $BL_n$ may be disposed on the second interlayer dielectric layer 175 while connecting the bitline plug BC and running across and over the word lines $WL_1$, $WL_2$, through to and $WL_{n-1}$ and $WL_n$. The bitlines $BL_1$, $BL_2$, through to $BL_{n-1}$, and $BL_n$ may be disposed parallel to the active regions Act.

FIGS. 4A and 4B are cross-sectional views of a selection transistor 100 according to embodiments of the inventive concept, which are taken along a line A-A' of FIG. 2. In FIGS. 4A and 4B, a ground selection transistor is given as an example, but a string selection transistor may have the same structure as the ground selection transistor.

Referring to FIG. 4A, a gate electrode 150c of the selection transistor 100 is disposed on the active region Act of the semiconductor substrate 101. A tunnel insulating layer 112a is interposed between the active region Act of the semiconductor substrate 101 and the gate electrode 150c. The gate electrode 150c includes recess portions 152 recessed inwards toward lower portions of the gate electrode 150c, thereby having a T-shaped cross section. The recess portions 152 may be filled with blocking insulating layers 130c and lower insulating layers 113a.

The tunnel insulating layer 112a may be formed of for example, a silicon oxide layer, and may be thicker than a tunnel insulating layer of a cell transistor (not shown) which is a non-volatile memory device. An insulating layer 110d disposed below the lower insulating layer 113a may have substantially the same thickness as the tunnel insulating layer of the cell transistor. As illustrated in FIG. 4A, the tunnel insulating layer 112a may be thicker than the insulating layer 110d. In FIG. 4A, a lower surface of the tunnel insulating layer 112a is illustrated to be lower than a top surface of the active region Act. Alternatively, the lower surface of the tunnel insulating layer 112a may be matched with the top surface of the active region Act.

As described above, the recess portions 152 may be filled with the blocking insulating layers 130c and the lower insulating layers 113a. The blocking insulating layer 130c may have the same configuration as the blocking insulating layer 135 of the cell transistor described above. Selectively, the blocking insulating layer 130c may be formed of an ONO film material of oxide-nitride-oxide. In addition, the lower insulating layer 113a may include an inner insulating layer 112b, an external insulating layer 114a, and a charge storage layer 120c disposed between the inner insulating layer 112b and the external insulating layer 114a. The charge storage layer 120c may be formed of an n-type or p-type polysilicon, and may be formed of the same material as the charge storage layer 133 of the cell transistor. The inner insulating layer 112b and the external insulating layer 114a may be formed by oxidizing a part of the charge storage layer 120c. Alternatively, the inner insulating layer 112b may be a separate insulating layer instead of material formed by oxidizing the charge storage layer 120c.

Selectively, a sidewall insulating layer 114b such as an oxide layer may be formed on the outside of the gate electrode 150c.

In addition, a side surface of the blocking insulating layer 130c and the lower insulating layer 113a, which faces the gate electrode 150c, may be self-aligned by the recess portion 152 of the gate electrode 150c.

FIG. 4B is a cross-sectional view of the selection transistor 100 according to another embodiment of the inventive concept. The selection transistor 100 of FIG. 4B is different from the selection transistor 100 of FIG. 4A only in the configuration of the lower insulating layer 113b, and thus its description will not be repeated for the common configurations. The selection transistor 100 of FIG. 4B is different from the selection transistor 100 of FIG. 4A in that an entire lower insulating layer 113b is composed of an insulator.

FIGS. 5A through 5I are cross-sectional views of a method of fabricating a selection transistor, according to an embodiment of the inventive concept, which correspond to views taken along lines A-A" and B-B' of FIG. 2 according to a fabricating process.

Figure 5A:
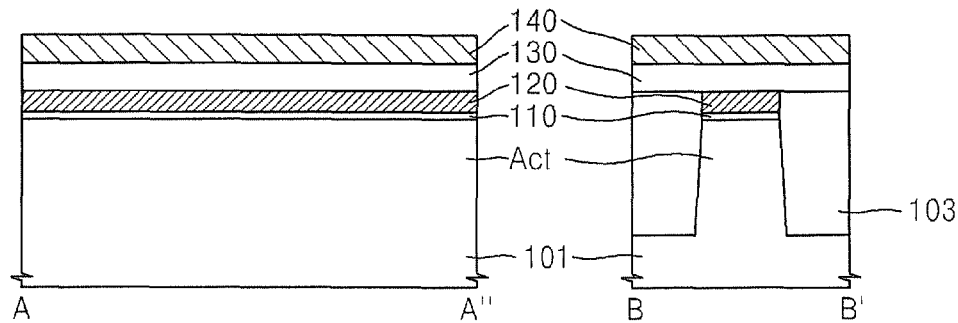
FIGS. 5A through 5I are cross-sectional views of a method of fabricating a selection transistor, according to an embodiment of the inventive concept, which correspond to views taken along lines A-A" and B-B' of FIG. 2 according to a fabricating process.

Referring to FIG. 5A, a tunnel insulating layer 110 and a charge storage layer 120 are sequentially formed on a semiconductor substrate 101. The semiconductor substrate 101 may be a silicon substrate, and the tunnel insulating layer 110 may be a silicon oxide layer. For example, the tunnel insulating layer 110 may be an oxide layer formed by thermal oxidation. The charge storage layer 120 may include at least one selected from the group consisting of a polysilicon layer, a $Si_3N_4$ layer, a nano crystalline silicon layer, a nano crystalline silicon germanium (SiGe) layer, a nano crystalline metal, an aluminum oxide ($Al_2O_3$) layer, a hafnium oxide ($HfO_2$) layer, a hafnium aluminum oxide (HfAlO) layer, a hafnium silicon oxynitride (HfSiON) layer and combinations thereof, and may include an n-conductive type material or a p-conductive type material.

In order to define an active region Act, a hard mask layer (not shown) may be formed on the charge storage layer 120.

The hard mask layer may be, for example, a silicon oxide layer or a silicon nitride layer. The active region Act may be defined by anisotropic-etching of the charge storage layer 120, the tunnel insulating layer 110 and the semiconductor substrate 101 using the hard mask as a patterning mask.

Then, the hard mask layer is removed, an insulating layer (not shown) is formed on the whole surface of the resultant, and then chemical mechanical polishing (CMP) is performed on the insulating layer by using the charge storage layer 120 as a planarization stopper, thereby obtaining a semiconductor substrate 101 in which the active region Act is defined by a device separation layer 103.

Then, a blocking insulating layer 130 and a first gate layer 140 are sequentially formed across an upper surface of the charge storage layer 120 and the device separation layer 103. The blocking insulating layer 130 is not limited to any particular insulating layer. For example, the blocking insulating layer 130 may be formed of an ONO film material of oxide-nitride-oxide. The first gate layer 140 may include at least one selected from the group consisting of polysilicon, tantalum nitride (TaN), tantalum (Ta), ruthenium (Ru), tungsten nitride (WN), tungsten (W), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo), platinum (Pt) and combinations thereof.

Figure 5B:
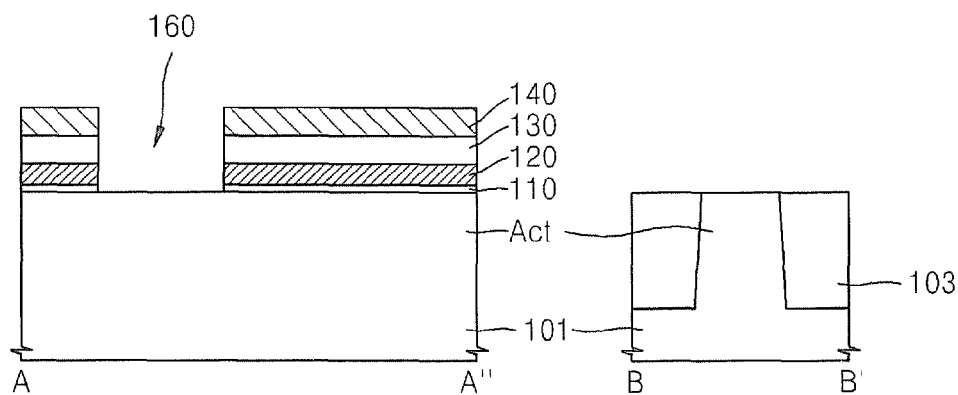

Referring to FIG. 5B, the active region Act is exposed by forming a trench 160 in a portion on which the selection transistor is to be formed. That is, an etch mask (not shown) is formed in order to expose a portion on which the trench 160 is to be formed. Anisotropic-etching is performed on the exposed portion, thereby removing portions of the first gate layer 140, the blocking insulating layer 130, the charge storage layer 120 and the tunnel insulating layer 110, which correspond to the exposed portion. Then, the etch mask is removed.

Figure 5C:
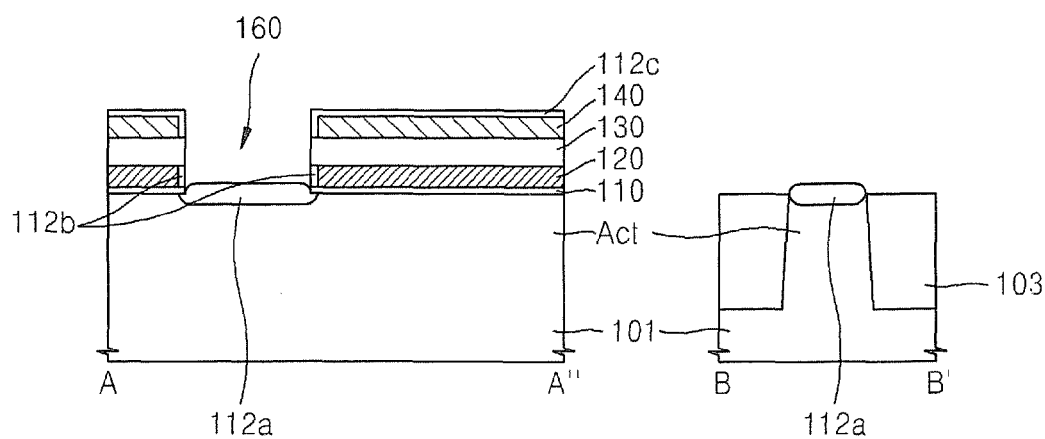

Referring to FIG. 5C, insulating layers 112a, 112b and 112c are formed on an entire surface of the active region Act, the charge storage layer 120 and the first gate layer 140. The insulating layers 112a, 112b and 112c may each be an oxide layer, and may be formed by thermal oxidation. Alternatively, the insulating layers 112a, 112b and 112c may be formed by depositing an insulating material by vapor deposition. A gate electrode will be formed on the insulating layer 112a, thereby functioning as a tunnel insulating layer.

Figure 5D:
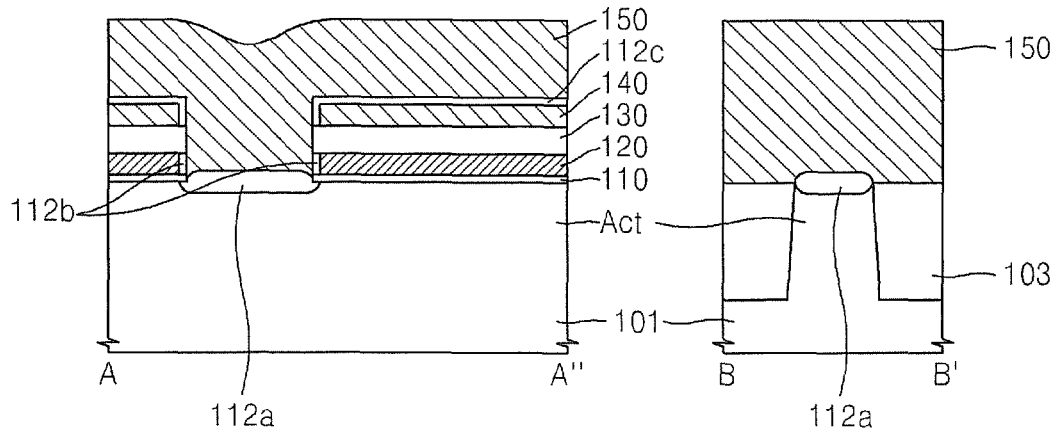
Figure 5E:
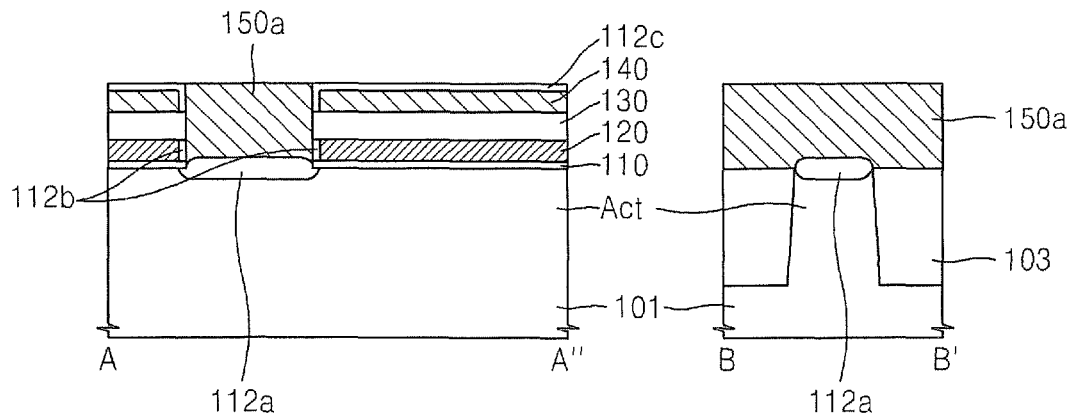

Referring to FIGS. 5D and 5E, a second gate layer 150a is formed in the trench 160. A second gate layer 150 is formed across an upper surface of the trench 160 and the insulating layer 112c in order to form the second gate layer 150a in the trench 160, and chemical mechanical polishing (CMP) is performed on the second gate layer 150 by using the insulating layer 112c as a planarization stopper, thereby obtaining the second gate layer 150a defined in the trench 160. The second gate layer 150a may be formed of the same material as the first gate layer 140.

Figure 5F:
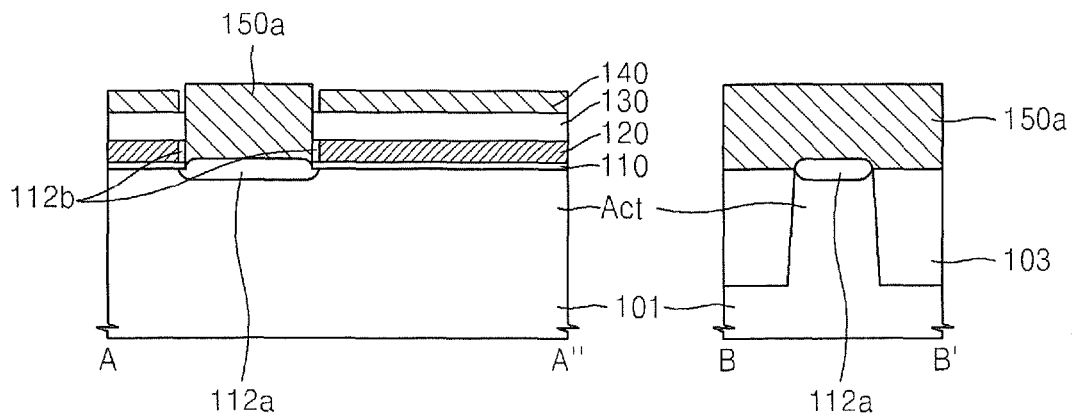

Referring to FIG. 5F, an exposed portion of the insulating layer 112c may be selectively removed. The insulating layer 112c may be selectively removed using a well-known method such as wet-etching. In particular, when the insulating layer 112c is an oxide layer, the insulating layer 112c may be selectively removed by using an etchant capable of selectively etching the oxide layer.

Figure 5G:
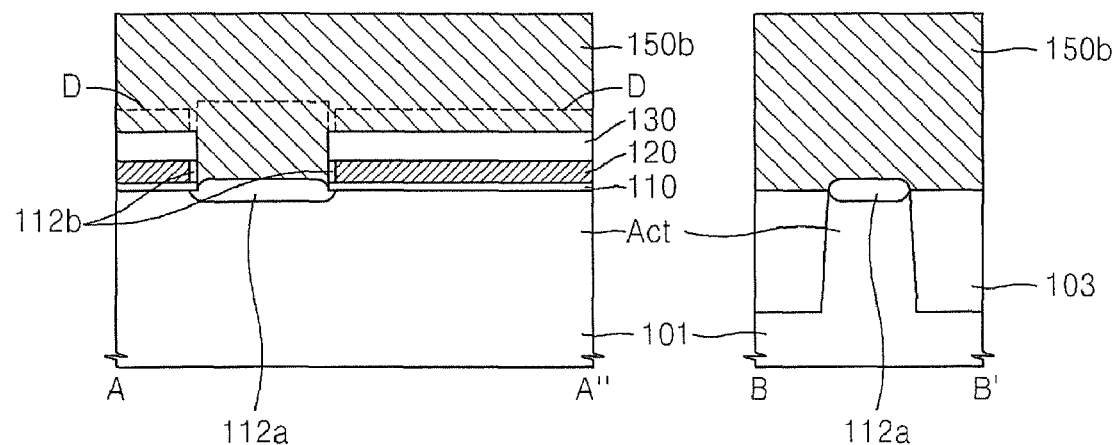

Referring to FIGS. 5F and 5G, a third gate layer 150b is formed across an exposed upper surface of the first gate layer 140 and the second gate layer 150a. The third gate layer 150b may be formed of the same material as the first gate layer 140 and the second gate layer 150a. Thus, as illustrated in FIG. 5G, after forming the third gate layer 150b, the first gate layer 140, the second gate layer 150a and the third gate layer 150b, which are distinguished by dotted lines, can be substantially undistinguishable.

Figure 5H:
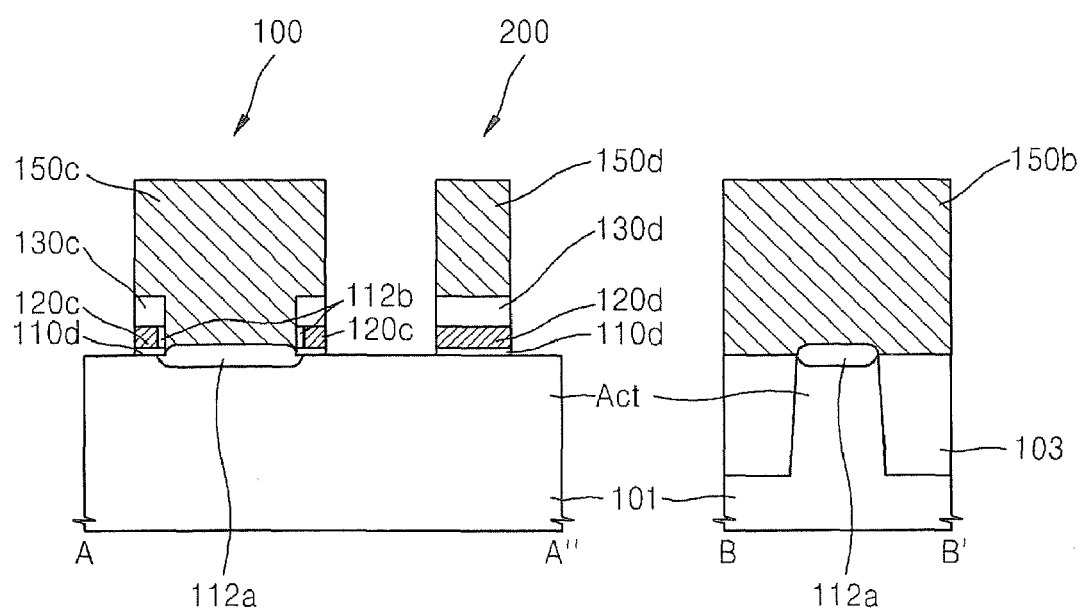

Referring to FIG. 5H, an etch mask (not shown) masking a portion on which a selection transistor 100 and a cell transistor 200 are to be formed is formed in order to define the selection transistor 100 and the cell transistor 200, the selection transistor 100 and the cell transistor 200 are formed by anisotropic-etching. In particular, the width of a portion of the etch mask, for forming the selection transistor 100, may be greater than the width of the tunnel insulating layer 112a. When the portion of the etch mask has the same thickness as the tunnel insulating layer 112a, a problem might occur due to misalignment. In addition, when the width of the portion of the etch mask is smaller than that of the tunnel insulating layer 112a, since portions to be etched are etched at different etching rates, a device failure might occur. As illustrated in FIG. 5H, a side surface of the charge storage layer 120 is exposed by anisotropic-etching.

The cell transistor 200 may include a charge storage layer 120d disposed on a tunnel insulating layer 110d, which may function as a floating gate, a blocking insulating layer 130d disposed on the charge storage layer 120d, and a gate electrode 150d disposed on the blocking insulating layer 130d, which may function as a control gate.

Figure 5I:
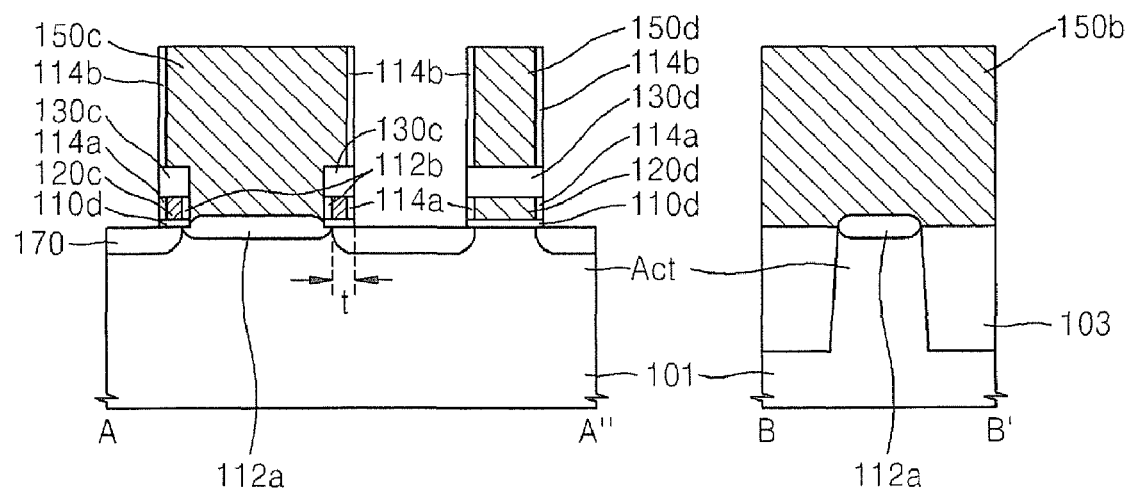

Referring to FIG. 5I, by performing ion-injection, a source/drain region 170 may be formed and side surfaces of the gate electrode 150c may be oxidized. As the side surfaces of the gate electrode 150c are oxidized, an exposed side surface of the charge storage layer 120c is also oxidized at the same time. Accordingly, the external insulating layer 114a is formed on a surface of the charge storage layer 120c, and the charge storage layer 120c which is a part of the charge storage layer 120 may be interposed between the external insulating layer 114a and the inner insulating layer 112b. The charge storage layer 120c may be fully oxidized when the oxidation is performed enough considering a thickness "t" (see FIG. 4B). The thickness "t" is measured in a horizontal direction and excludes the inner insulating layer 112b.

FIGS. 6A through 6F are cross-sectional views of a method of fabricating a selection transistor, according to another embodiment of the inventive concept, which correspond to views taken along lines A-A" and B-B' of FIG. 2 according to a fabricating process.

Figure 6A:
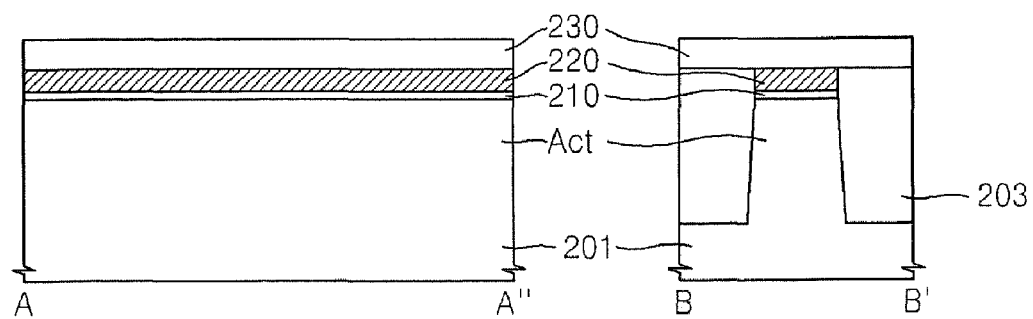
FIGS. 6A through 6F are cross-sectional views of a method of fabricating a selection transistor, according to another embodiment of the inventive concept, which correspond to views taken along lines A-A" and B-B' of FIG. 2 according to a fabricating process.

Referring to FIG. 6A, a tunnel insulating layer 210 and a charge storage layer 220 may be sequentially formed on a semiconductor substrate 201, a hard mask layer (not shown) may be formed as a patterning mask for defining an active region Act on the charge storage layer 220, and then the charge storage layer 220, the tunnel insulating layer 210 and the semiconductor substrate 201 may be anisotropically etched, thereby defining the active region Act. After removing the hard mask layer, an insulating layer is formed on an entire surface of the resultant, and then chemical mechanical polishing (CMP) is performed on the insulating layer by using the charge storage layer 220 as a planarization stopper, thereby obtaining the semiconductor substrate 201 in which the active region Act is defined by a device separation layer 203. Then, a blocking insulating layer 230 is formed across an upper surface of the charge storage layer 220 and the device separation layer 203.

Figure 6B:
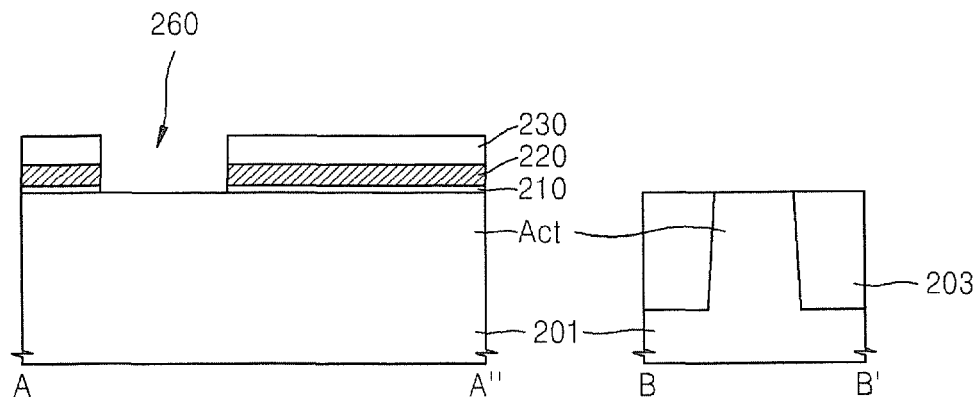

Referring to FIG. 6B, the active area Act is exposed by forming a trench 260 in a portion on which the selection transistor is to be formed. That is, an etch mask (not shown) is formed in order to expose a portion on which the trench 260 is to be formed. Anisotropic-etching is performed on the exposed portion, thereby removing portions of the blocking insulating layer 230, the charge storage layer 220 and the tunnel insulating layer 210, which correspond to the exposed portion. Then, the etch mask is removed.

Figure 6C:
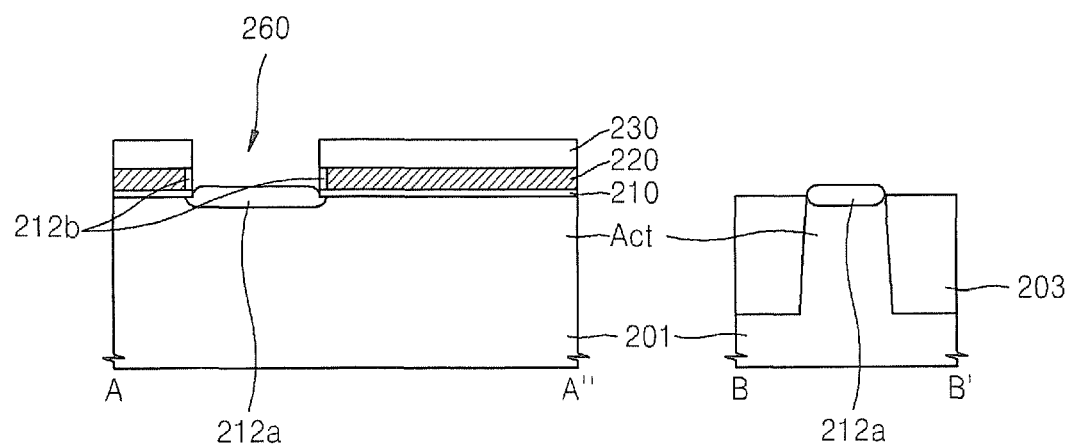

Referring to FIG. 6C, insulating layers 212a and 212b are formed on an entire surface of the active region Act and the charge storage layer 220. The insulating layers 212a and 212b may each be an oxide layer, and may be formed by thermal oxidation. In addition, the insulating layers 212a and 212b may be formed by depositing an insulating material by vapor deposition. A gate electrode will be formed on the insulating layer 212a, thereby functioning as a tunnel insulating layer.

Figure 6D:
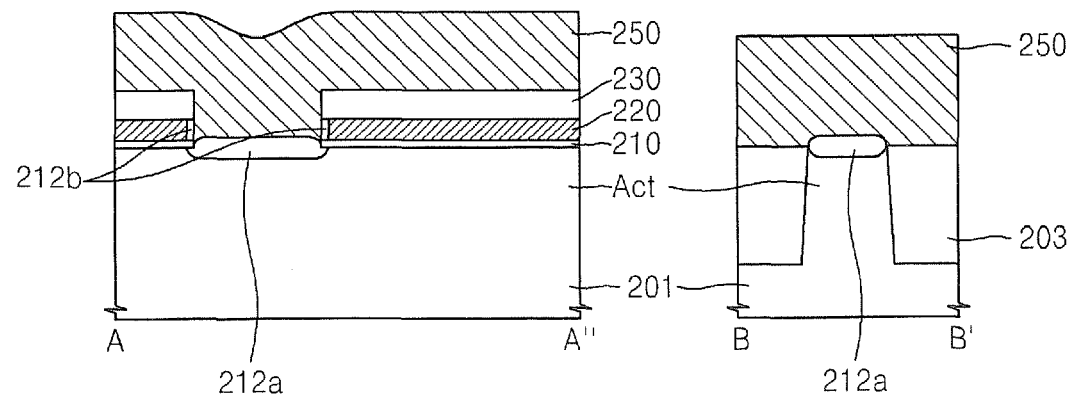

Referring to FIG. 6D, a first gate layer 250 is formed across an upper surface of the insulating layers 212a and 212b and the blocking insulating layer 230 in order to fill the trench 260. The first gate layer 250 may include at least one selected from the group consisting of polysilicon, tantalum nitride (TaN), tantalum (Ta), ruthenium (Ru), tungsten nitride (WN), tungsten (W), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo), platinum (Pt) and combinations thereof.

Figure 6E:
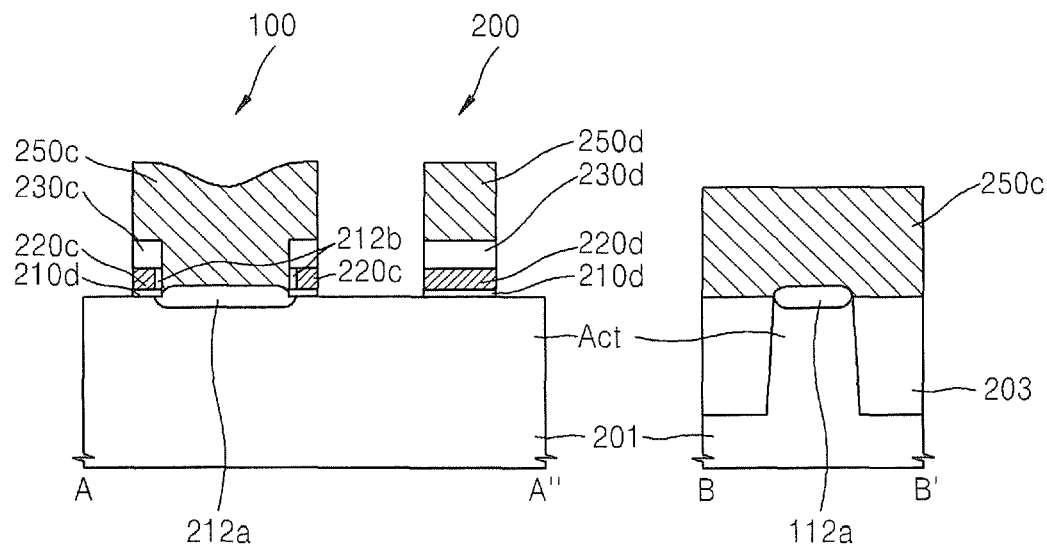

Referring to FIG. 6E, an etch mask (not shown) masking a portion on which a selection transistor 100 and a cell transistor 200 are to be formed is formed in order to define the selection transistor 100 and the cell transistor 200, wherein the selection transistor 100 and the cell transistor 200 are formed by anisotropic-etching. In particular, the width of a portion of the etch mask, for forming the selection transistor 100, may be greater than the width of the tunnel insulating layer 212a. A side surface of the charge storage layer 220 is exposed by anisotropic-etching.

The cell transistor 200 may include a charge storage layer 220d disposed on a tunnel insulating layer 210d, which may function as a floating gate, a blocking insulating layer 230d disposed on the charge storage layer 220d, and a gate electrode 250d disposed on the blocking insulating layer 250d, which may function as a control gate.

Figure 6F:
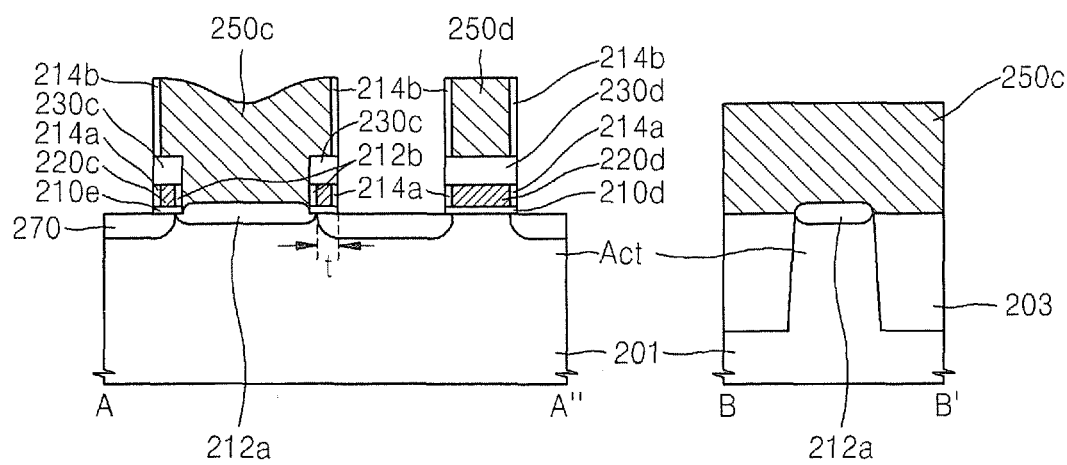

Referring to FIG. 6F, by performing ion-injection, a source/drain region 270 is formed and side surfaces of the gate electrode 250c may be oxidized. As the side surfaces of the gate electrode 250c are oxidized, an exposed side surface of the charge storage layer 220 is also oxidized at the same time. Accordingly, an external insulating layer 214a is formed on a surface of the charge storage layer 220, and the charge storage layer 220c which is a part of the charge storage layer 220 may be interposed between the external insulating layer 214a and the inner insulating layer 212b. The charge storage layer 220c may be fully oxidized when the oxidation is performed enough considering a thickness "t" (see FIG. 4B). The thickness "t" is measured in a horizontal direction and excludes the inner insulating layer 212b.

Figure 7:
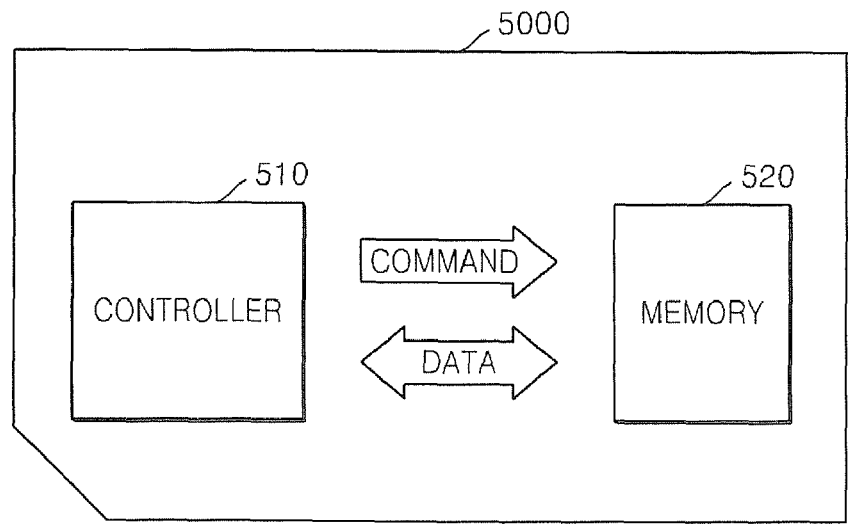
FIG. 7 is a schematic view illustrating a memory card according to an embodiment of the inventive concept.

FIG. 7 is a schematic view illustrating a memory card 5000 according to an embodiment of the inventive concept.

Referring to FIG. 7, a controller 510 and a memory 520 are disposed to send and receive electric signals to and from each other. For example, when the controller 510 gives a command to the memory 520, the memory 520 can send data. The memory 520 may be a memory including a selection transistor according to an embodiment of the inventive concept. The selection transistors according to the various embodiments of the inventive concept can be disposed in NAND architecture arrays in correspondence to the logic gate design Such NAND arrays are well known to those of ordinary skill in the art. The memory arrays disposed in a plurality of rows and columns can have one or more memory array banks (not shown). The memory 520 can include the memory array (not shown) or the memory array bank (not shown), all of which are well known to those of ordinary skill in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are well known to those of ordinary skill in the art. The memory card 5000 can be used in memory devices as a memory card, for example, such as a memory stick card, a smart media (SM) card, a secure digital (SD) card, a mini SD card, or a multi media card (MMC).

Figure 8:
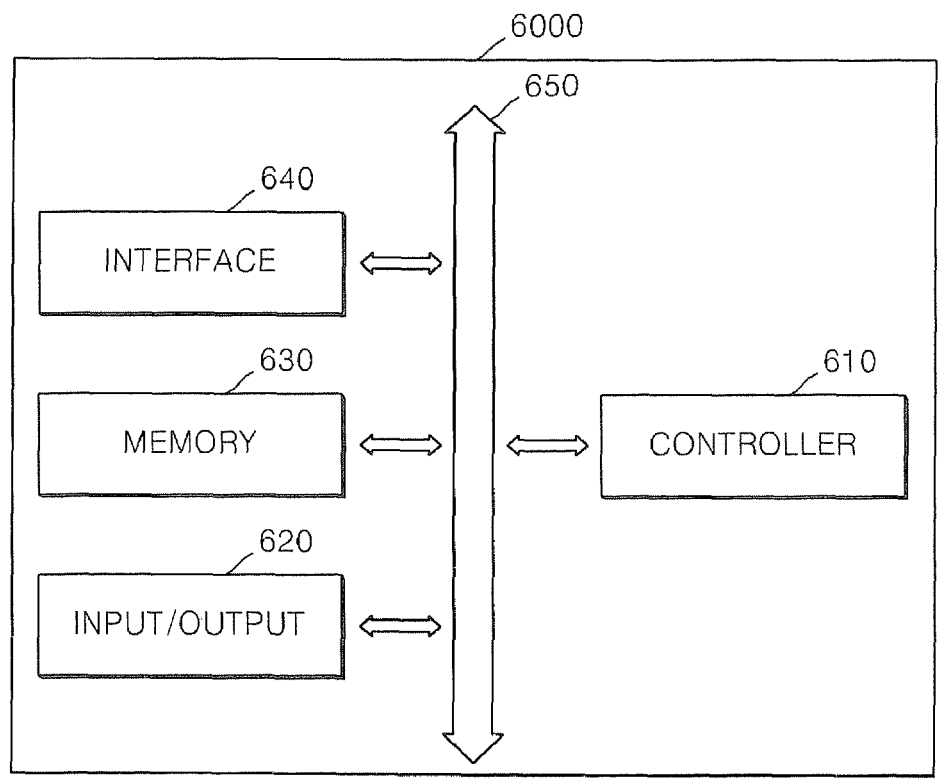
FIG. 8 is a schematic diagram of a system including a non-volatile memory device according to an embodiment of the inventive concept.

FIG. 8 is a schematic diagram of a system 6000 including a non-volatile memory device according to some embodiments.

Referring to FIG. 8, the system 6000 may include a controller 610, an input/output device 620, a memory 630, and an interface 640. The system 6000 may be a mobile system or a system that transmits or receives data. The mobile system may be a personal digital assistant (PDA), a portable computer, a web tablet, a wireless phone, a mobile phone, a digital music player, or a memory card. The controller 610 executes a software program and controls the system 6000. The controller 610 may be a microprocessor, a digital signal processor, a microcontroller, or the like. The input/output device 630 can be used to input or output data of the system 6000. The system 6000 is connected to an external apparatus, for example, a personal computer or a network, by using the input/output device 620, to send and receive data to and from the external apparatus. The input/output device 620 may be a keypad, a keyboard, or a display. The memory 630 may store codes and/or data for operating the controller 610 and/or may store data processed by the controller 610. The memory 630 may include a non-volatile memory device according to some embodiments. The interface 640 may be a data transmission path between the system 6000 and an external apparatus. The controller 610, the input/output device 620, the memory 630, and the interface 640 may communicate with one another via a bus 650. For example, the system 6000 can be used in a mobile phone, an MP3 player, a navigation system, a portable multimedia player (PMP), a solid state disk (SSD), or a household appliance.

While the inventive concept has been particularly shown and described with reference to exemplary embodiments thereof, it will be understood that various changes in form and details may be made therein without departing from the spirit and scope of the following claims.

What is claimed is:

1. A selection transistor formed on an active region in a semiconductor substrate, the selection transistor comprising:
   a gate electrode including recessed portions of a sidewall of the gate electrode recessed inward adjacent lower portions of the gate electrode to define a T-shaped cross section of the gate electrode; and
   a tunnel insulating layer between the gate electrode and the active region, wherein the recessed portions of the gate electrode are each filled with a blocking insulating layer and a lower insulating layer, which are vertically stacked;
   wherein a side surface of the blocking insulating layer and the lower insulating layer, which faces the gate electrode, is self-aligned by the recessed portion of the gate electrode;
   wherein the lower insulating layer comprises an inner insulating layer formed adjacent to the recessed portion of the gate electrode, an external insulating layer formed along an external surface of the lower insulating layer, and a charge storage layer formed between the inner insulating layer and the external insulating layer.

2. The selection transistor of claim 1, wherein a thickness of the tunnel insulating layer is greater than a thickness of a tunnel insulating layer of a nonvolatile memory device.

3. The selection transistor of claim 2, wherein the gate electrode is formed of n-type polysilicon, and the charge storage layer is formed of p-type polysilicon.

4. The selection transistor of claim 1, wherein the gate electrode is formed of n-type polysilicon.

5. The selection transistor of claim 1, wherein the recessed portions of the gate electrode encircle the lower portion of the gate electrode to define the T-shaped cross section in two orthogonal directions.

6. The selection transistor of claim 1 wherein the recessed portions of the gate electrode are absent from the sidewall above the lower portions thereof away from the tunnel insulating layer.

7. A memory card comprising:
a memory including the selection transistor of claim 1; and
a controller controlling the memory and transmitting and receiving data to and from the memory.

8. A system comprising:
a memory including the selection transistor of claim 1; and
a processor communicating with the memory via a bus; and
an input/output apparatus communicating with the bus.

* * * * *